United States Patent
Van Bommel et al.

(10) Patent No.: US 11,852,322 B2
(45) Date of Patent: Dec. 26, 2023

(54) FILAMENT LAMP WITH IMPROVED VISIBILITY

(71) Applicant: SIGNIFY HOLDING B.V., Eindhoven (NL)

(72) Inventors: Ties Van Bommel, Horst (NL); Rifat Ata Mustafa Hikmet, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 18/010,532

(22) PCT Filed: Jun. 14, 2021

(86) PCT No.: PCT/EP2021/065876
§ 371 (c)(1),
(2) Date: Dec. 15, 2022

(87) PCT Pub. No.: WO2021/254923
PCT Pub. Date: Dec. 23, 2021

(65) Prior Publication Data
US 2023/0258320 A1    Aug. 17, 2023

(30) Foreign Application Priority Data

Jun. 18, 2020  (EP) .................................. 20180785

(51) Int. Cl.
*F21V 19/00* (2006.01)
*F21K 9/64* (2016.01)
(Continued)

(52) U.S. Cl.
CPC ............ *F21V 19/002* (2013.01); *F21K 9/232* (2016.08); *F21K 9/64* (2016.08); *F21Y 2107/50* (2016.08); *F21Y 2115/10* (2016.08)

(58) Field of Classification Search
CPC .......... F21V 19/002; F21K 9/232; F21K 9/64; F21Y 2107/50; F21Y 2115/10
See application file for complete search history.

(56) References Cited

U.S. PATENT DOCUMENTS 8,400,051 B2    3/2013 Hakata et al.
10,107,456 B2 * 10/2018 Dau ........................ F21V 23/06
(Continued)

FOREIGN PATENT DOCUMENTS

| CN | 107887491 A | 4/2018 |
| CN | 207407082 U | 5/2018 |

(Continued)

*Primary Examiner* — Evan P Dzierzynski (57) ABSTRACT

The invention provides a light generating device (1000) comprising an LED filament (100), wherein the LED filament (100) comprises a support (105), a set (107) of solid state light sources (110), and an encapsulant (160), wherein: (I) the LED filament (100) has a length axis (108) having a first length (L1); (II) the solid state light sources (110) are arranged over the first length (L1) of the LED filament (100) on the support (105), wherein the solid state light sources (110) are configured to generate light source light (111); (III) the encapsulant (160) encloses at least part of each of the solid state light sources (110) of the set (107) of solid state light sources (110), wherein the encapsulant (160) comprises a luminescent material (200) configured to convert at least part of the light source light (111) into luminescent material light (201); (IV) the light generating device (1000) is configured to generate device light (1001) comprising one or more of (i) the light source light (111) and (ii) the luminescent material light (201); (V) for each of the solid state light sources (110) of the set (107) of solid state light sources (110) applies that relative to a first virtual plane (171) parallel to the length axis (108) and intersecting with the solid state light source (110) the encapsulant (160) is asymmetrically configured relative to the first virtual plane (171).

14 Claims, 5 Drawing Sheets

(51) Int. Cl.
*F21K 9/232* (2016.01)
*F21Y 107/50* (2016.01)
*F21Y 115/10* (2016.01)

(56) References Cited

U.S. PATENT DOCUMENTS

| | | | |
|---|---|---|---|
| 11,177,422 B2* | 11/2021 | Basalla | H01L 25/0753 |
| 2017/0241598 A1 | 8/2017 | Jiang et al. | |
| 2018/0315899 A1* | 11/2018 | Li | F21V 31/00 |
| 2018/0328543 A1* | 11/2018 | Bergmann | H05B 45/3577 |
| 2019/0137047 A1* | 5/2019 | Hu | F21K 9/238 |
| 2020/0173611 A1 | 6/2020 | Hofmann et al. | |
| 2021/0148533 A1* | 5/2021 | Van Bommel | F21S 10/04 |
| 2022/0390073 A1* | 12/2022 | Weijers | F21K 9/232 |

FOREIGN PATENT DOCUMENTS

| | | |
|---|---|---|
| CN | 110030508 A | 7/2019 |
| EP | 3460313 A1 | 3/2019 |
| WO | 2018157428 A1 | 9/2018 |
| WO | 2019197394 A1 | 10/2019 |
| WO | 2020016058 A1 | 1/2020 |
| WO | 2020120438 A1 | 6/2020 |
| WO | 2020190960 A1 | 9/2020 |

* cited by examiner

FILAMENT LAMP WITH IMPROVED VISIBILITY

CROSS-REFERENCE TO PRIOR APPLICATIONS

This application is the U.S. National Phase application under 35 U.S.C. § 371 of International Application No. PCT/EP2021/065876, filed on Jun. 14, 2021, which claims the benefit of European Patent Application No. 20180785.6, filed on Jun. 18, 2020. These applications are hereby incorporated by reference herein.

FIELD OF THE INVENTION

The invention relates to a light generating device and to a lamp comprising such light generating device.

BACKGROUND OF THE INVENTION

Filament-type of light generating devices are known in the art. U.S. Pat. No. 8,400,051 B2, for instance, describes a light-emitting device comprising: an elongated bar-shaped package with left and right ends, the package being formed such that a plurality of leads are formed integrally with a first resin with part of the leads exposed; a light-emitting element that is fixed onto at least one of the leads and that is electrically connected to at least one of the leads; and a second resin sealing the light-emitting element, wherein the leads are formed of metal, an entire bottom surface of the light-emitting element is covered with at least one of the leads, an entire bottom surface of the package is covered with the first resin, the first resin has a side wall that is integrally formed with a portion covering the bottom surface of the package and that is higher than upper surfaces of the leads, the first resin and the second resin are formed of optically transparent resin, the second resin that is filled to a top of the side wall of the first resin and that includes a fluorescent material having a larger specific gravity than that of the second resin, the leads have outer lead portions that are used for external connection and that protrude in a longitudinal direction of the package from the left and right ends wherein the fluorescent material is arranged to concentrate near the light emitting element, and is excited by part of light emitted by the light-emitting element so as to emit a color different from a color of the light emitted by the light-emitting element, and the side wall transmits part of light that is emitted by the light-emitting element and that enters the side wall and part of light emitted from the fluorescent material to the portion covering the bottom surface of the package.

SUMMARY OF THE INVENTION

Incandescent lamps are rapidly being replaced by LED based lighting solutions. It may nevertheless be appreciated and desired by users to have retrofit lamps which have the look of an incandescent bulb. For this purpose, one may make use of the infrastructure for producing incandescent lamps based on glass and replace the filament with LEDs emitting white light. One of the concepts is based on LED filaments placed in such a bulb. The appearances of these lamps are highly appreciated as they look highly decorative.

In order to improve the vintage look of these LED filament lamps the LED filaments may emit relatively warm white light (e.g. 2200 K). However, a drawback of this solution is that when using these LED filament lamps for general illumination purposes color recognition may be unsatisfactory. Hence, there is a need for improved LED filament lamps that provide e.g. decorative and/or warm lighting with improved visibility of objects and colors (functional lighting).

Hence, it is an aspect of the invention to provide an alternative light generating device, which preferably further at least partly obviates one or more of above-described drawbacks. The present invention may have as object to overcome or ameliorate at least one of the disadvantages of the prior art, or to provide a useful alternative.

Amongst others, it is herein proposed to provide a LED filament lamp having an improved visibility of objects and colors. Especially, such a LED filament lamp can be made of a LED filament comprising a plurality of LEDs arranged on a flexible elongated carrier. Herein, in embodiments the plurality of LEDs may be at least partly covered by an encapsulant comprising a luminescent material for partly converting LED light into converted light. Especially, in embodiments the LEDs are asymmetrically arranged with respect to the encapsulant.

Hence, in an aspect the invention provides a light generating device ("device" or "lighting device") comprising an LED filament ("filament"), wherein the LED filament comprises a support, a set of solid state light sources ("light sources"), and an encapsulant. The LED filament may have a length axis having a first length (L1). Especially, the solid state light sources are arranged over the first length (L1) of the LED filament on the support. Further, the solid state light sources are configured to generate light source light (during operation of the light generating device). Especially, in embodiments the encapsulant encloses at least part of each of the solid state light sources of the set of solid state light sources. Further, the encapsulant may comprise a luminescent material configured to convert at least part of the light source light into luminescent material light. Especially, the light generating device is configured to generate device light comprising one or more of (i) the light source light and (ii) the luminescent material light, more especially both the light source light and the luminescent material light. In embodiments, would at one or more light sources the color point be measured along a circle surrounding the respective light source, wherein the circle would be perpendicular to the axis of elongation, an intensity (energy basis) averaged color point at one side of the circle would differ from an intensity (energy basis) averaged color point at the other side of the circle. For instance, one or more of u' and v' may differ at least 0.05. Further, in specific embodiments, for each of the solid state light sources of the set of solid state light sources may apply that relative to a first virtual plane parallel to length axis and intersecting with the solid state light source the encapsulant is asymmetrically configured relative to the first virtual plane. Hence, in specific embodiments the invention provides a light generating device comprising an LED filament, wherein the LED filament comprises a support, a set of solid state light sources, and an encapsulant, wherein: (I) the LED filament has a length axis having a first length (L1); (II) the solid state light sources are arranged over the first length (L1) of the LED filament on the support, wherein the solid state light sources are configured to generate light source light; (III) the encapsulant encloses at least part of each of the solid state light sources of the set of solid state light sources, wherein the encapsulant comprises a luminescent material configured to convert at least part of the light source light into luminescent material light; (IV) the light generating device is configured to generate device light comprising one or more of (i) the light source light and (ii) the luminescent material light; and (V) for each of the solid state light sources of the set of solid state light sources applies that relative to a first virtual plane parallel to length axis and intersecting with the solid state light source the encapsulant is asymmetrically configured relative to the first virtual plane.

With such light generating device, it is possible to provide in one direction (relatively) warm(er) white light, and in the other direction cool(er) white light. Hence, in one direction sphere lighting or deco lighting may be provided, whereas in another direction relatively more functional light (e.g. for improved reading/readability and/or visibility) may be provided. However, with such light generating device it is also possible to provide in one direction light having a first color point and in another direction light with a second color point. Hence, in embodiments one side may be used for functional lighting and another side may be used for decorative lighting and/or sphere lighting. Further, the spatial change in correlated color temperature or color point may essentially be gradual, which may also be desirable.

As indicated above, the light generating device comprising an LED filament, wherein the LED filament comprises a support, a set of solid state light sources, and an encapsulant. LED filaments as such are known, and are e.g. described in U.S. Pat. No. 8,400,051 B2, WO2020016058, WO2019197394, etc., which are herein incorporated by reference. The number of light sources in the set may be at least 4, such as at least 8, even more especially at least 12, and may e.g. be up to 100, or yet even larger. Especially, in embodiments the number of light sources in the set may be selected from the range of 10-1000, such as 10-200.

The LED filament has a length axis having a first length (L1). Hence, the length axis especially defines the length of the LED filament. The LED filament may be straight or may be curved. The support (see also below) of the LED filament may have an elongated body axis. The length axis may essentially be the same as the body axis. As indicated above, the body axis may be curved, as the LED filament may be curved. For instance, the filament may have a kind of helical shape, or other curved shape.

The solid state light sources are arranged over the first length (L1) of the LED filament on the support. Hence, over at least part of the length the solid state light sources are arranged. Hence, the light source may be configured in a 1D array over at least part of the length. A first and a last solid state light source may, when measured along the LED filament, have a mutual distance of at least 0.5*L1, even more especially 0.7*L1 (i.e. 70% of the first length). In embodiments, the solid state light source may be configured in two 1D arrays, one at one side of the support and one at the other side of the support. The invention is herein described in relation to solid state light sources at least partly encapsulated at one side of the support. However, the same could apply the solid state light sources at the other side of the support. Herein, 2D arrays of the solid state light sources are not excluded. However, then an array of solid state light source perpendicular to the length axis may be considered herein as a single solid state light sources. Further, the invention is herein especially described in relation to a 1D array of solid state light sources (unless indicated otherwise).

The term "light source" may refer to a semiconductor light-emitting device, such as a light emitting diode (LEDs), a resonant cavity light emitting diode (RCLED), a vertical cavity laser diode (VCSELs), an edge emitting laser, etc. The term "light source" may also refer to an organic light-emitting diode, such as a passive-matrix (PMOLED) or an active-matrix (AMOLED). In a specific embodiment, the light source comprises a solid state light source (such as a LED or laser diode). In an embodiment, the light source comprises a LED (light emitting diode). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module. The term "light source" may also relate to a plurality of (essentially identical (or different)) light sources, such as 2-2000 solid state light sources. In embodiments, the light source may comprise one or more micro-optical elements (array of micro lenses) downstream of a single solid state light source, such as a LED, or downstream of a plurality of solid state light sources (i.e. e.g. shared by multiple LEDs). In embodiments, the light source may comprise a LED with on-chip optics. In embodiments, the light source comprises a pixelated single LEDs (with or without optics) (offering in embodiments on-chip beam steering).

The phrases "different light sources" or "a plurality of different light sources", and similar phrases, may in embodiments refer to a plurality of solid state light sources selected from at least two different bins. Likewise, the phrases "identical light sources" or "a plurality of same light sources", and similar phrases, may in embodiments refer to a plurality of solid state light sources selected from the same bin.

Herein, in embodiments the solid state light sources within the set are especially essentially the same. Hence, they may e.g. be from the same bin. Therefore, in specific embodiments they may be configured to generate light source light having essentially the same color point and/or essentially the same dominant wavelength. In yet other embodiments, the solid state light sources comprise a limited number of different light sources, such as up to about 5, such as up to about 4, different types of solid state light sources, more especially up to about 3 different types of different solid state light sources. Therefore, in specific embodiments they may be configured to generate light source light having different color points and/or dominant wavelengths. Herein, the invention is especially described with embodiments wherein the solid state light sources are essentially identical (in the set of solid state lights sources).

In specific embodiments, colors or color points of a first type of light and a second type of light may be different when the respective color points of the first type of light and the second type of light differ with at least 0.01 for u' and/or with least 0.01 for v', even more especially at least 0.02 for u' and/or with least 0.02 for v'. In yet more specific embodiments, the respective color points of first type of light and the second type of light may differ with at least 0.03 for u' and/or with least 0.03 for v'. In other specific embodiments, colors or color points of a first type of light and a second type of light may be essentially the same when the respective color points of the first type of light and the second type of light differ with at maximum 0.03 for u' and/or with least 0.03 for v', even more especially at maximum 0.02 for u' and/or with least 0.02 for v'. In yet more specific embodiments, the respective color points of first type of light and the second type of light may differ with at maximum 0.01 for u' and/or with least 0.01 for v'. Here, u' and v' are color coordinate of the light in the CIE 1976 UCS (uniform chromaticity scale) diagram.

It may also be possible that the light source light of the solid state light sources at one side of the support has another spectral distribution and/or intensity than the light source light of the solid state light sources at another side of the support (in embodiments wherein solid state light sources are available at both sides of the support). Further, in embodiments, in addition to the solid state light sources from the set of solid state light sources, also other solid state light sources may be comprised by the light generating device. Especially, herein the filament comprises the set of solid state light sources and no other light sources, unless they also form a set as defined herein with the accompanying herein defined conditions.

In embodiments, the solid state light sources comprise LEDs. Alternatively or additionally, in embodiments the solid state light sources comprise diode lasers. Especially, the solid state light sources comprise LEDs.

As indicated above, the solid state light sources are configured to generate light source light. In embodiments, the light source light is blue light.

The terms "blue light" or "blue emission" especially relates to light having a wavelength in the range of about 440-495 nm (including some violet and cyan hues). The terms "violet light" or "violet emission" especially relates to light having a wavelength in the range of about 380-440 nm. The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component. The terms "visible", "visible light" or "visible emission" and similar terms refer to light having one or more wavelengths in the range of about 380-780 nm. The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to (at least) visible light.

As indicated above, the encapsulant encloses at least part of each of the solid state light sources of the set of solid state light sources. Hence, for each of the solid state light sources in the set applies that the encapsulant encapsulates at least part of the respective solid state light source. In general, the encapsulant is in contact with the support and covers the entire solid state light source. Herein, this may also be the case; however, also embodiments are herein contemplated wherein the encapsulant partly encapsulates the solid state light sources. Further, especially the encapsulant covers at least partly at least part of all the solid state light sources in the set of solid state light sources. Hence, in specific embodiments the (angular distribution of the) spectral power distribution may substantially be the same for each of the solid state light sources in the set, though this not necessarily the case.

Hence, in embodiments the encapsulant is configured over a substantial part of the length of the support (such as over more than 70% of the length of the filament) and may be a continuous coating, covering a plurality of solid state light sources, such as at least 2, like at least 5, more especially at least 10, such as in embodiments at least 50% of the total number of solid state light sources in the set). The encapsulant may be a continuous coating along the length of the filament, at one or both sides of the support. The solid state light source may have a light emitting surface, such as a LED die. Herein, the phrase "the encapsulant encloses at least part of the solid state light source", and similar phrases, especially indicate that at least part of the light emitting surface is enclosed by the encapsulant.

The encapsulant comprises a luminescent material configured to convert at least part of the light source light into luminescent material light. Hence, the luminescent material is configured downstream of the solid state light source(s).

The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

The term "luminescent material" especially refers to a material that can convert first radiation, especially one or more of UV radiation and blue radiation, into second radiation. In general, the first radiation and second radiation have different spectral power distributions. Hence, instead of the term "luminescent material", also the terms "luminescent converter" or "converter" may be applied. In general, the second radiation has a spectral power distribution at larger wavelengths than the first radiation, which is the case in the so-called down-conversion. In specific embodiments, however the second radiation has a spectral power distribution with intensity at smaller wavelengths than the first radiation, which is the case in the so-called up-conversion.

In embodiments, the "luminescent material" may especially refer to a material that can convert radiation into e.g. visible and/or infrared light. For instance, in embodiments the luminescent material may be able to convert one or more of UV radiation and blue radiation, into visible light. The luminescent material may in specific embodiments also convert radiation into infrared radiation (IR). Hence, upon excitation with radiation, the luminescent material emits radiation. In general, the luminescent material will be a down converter, i.e. radiation of a smaller wavelength is converted into radiation with a larger wavelength ($\lambda_{ex} < \lambda_{em}$), though in specific embodiments the luminescent material may comprise down-converter luminescent material, i.e. radiation of a larger wavelength is converted into radiation with a smaller wavelength ($\lambda_{ex} > \lambda_{em}$).

In embodiments, the term "luminescence" may refer to phosphorescence. In embodiments, the term "luminescence" may also refer to fluorescence. Instead of the term "luminescence", also the term "emission" may be applied. Hence, the terms "first radiation" and "second radiation" may refer to excitation radiation and emission (radiation), respectively. Likewise, the term "luminescent material" may in embodiments refer to phosphorescence and/or fluorescence. The term "luminescent material" may also refer to a plurality of different luminescent materials. Examples of possible luminescent materials are indicated below.

Embodiments of garnets especially include $A_3B_5O_{12}$ garnets, wherein A comprises at least yttrium or lutetium and wherein B comprises at least aluminum. Such garnets may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of A1, more especially up to about 10% of Al (i.e. the B ions essentially consist of 90 or more mole % of Al and 10 or less mole % of one or more of Ga, Sc and In); B may especially comprise up to about 10% gallium. In another variant, B and 0 may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1.

The term ":Ce", indicates that part of the metal ions (i.e. in the garnets: part of the "A" ions) in the luminescent material is replaced by Ce. For instance, in the case of $(Y_{1-x}Lu_x)_3A_{15}O_{12}$:Ce, part of Y and/or Lu is replaced by Ce. This is known to the person skilled in the art. Ce will replace A in general for not more than 10%; in general, the Ce concentration will be in the range of 0.1 to 4%, especially 0.1 to 2% (relative to A). Assuming 1% Ce and 10% Y, the full correct formula could be $(Y_{0.1}Lu_{0.89}Ce_{0.01})_3A_{15}O_{12}$.

Ce in garnets is substantially or only in the trivalent state, as is known to the person skilled in the art.

Blue luminescent concentrators can be based on YSO $(Y_2SiO_5:Ce^{3+})$, or similar compounds, or BAM $(BaMgAl_{10}O_{17}:Eu^{2+})$, or similar compounds, especially configured as single crystal(s).

In embodiments, a red luminescent material may comprise one or more materials selected from the group consisting of (Ba,Sr,Ca)S:Eu, (Ba,Sr,Ca)AlSiN$_3$:Eu and (Ba,Sr,Ca)$_2$Si$_5$N$_8$:Eu. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by Eu$^{2+}$). For instance, assuming 2% Eu in CaAlSiN$_3$:Eu, the correct europium formula could be (Ca$_{0.98}$Eu$_{0.02}$)AlSiN$_3$. Divalent europium will in general replace divalent cations, such as the above divalent alkaline earth cations, especially Ca, Sr or Ba.

The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Further, the material (Ba,Sr,Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as Ba$_{1.5}$Sr$_{0.5}$Si$_5$N$_8$:Eu (i.e. 75% Ba; 25% Sr). Here, Eu is introduced and replaces at least part of M, i.e. one or more of Ba, Sr, and Ca).

Likewise, the material (Ba,Sr,Ca)AlSiN$_3$:Eu can also be indicated as MAlSiN$_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Eu in the above indicated luminescent materials is substantially or only in the divalent state, as is known to the person skilled in the art.

The term "luminescent material" herein especially relates to inorganic luminescent materials, which are also sometimes indicated as phosphors. These terms are known to the person skilled in the art.

Alternatively or additionally, also other luminescent materials may be applied. For instance quantum dots and/or organic dyes may be applied and may optionally be embedded in transmissive matrices like e.g. polymers, like PMMA, or polysiloxanes, etc. etc.

Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide (CuInS$_2$) and/or silver indium sulfide (AgInS$_2$) can also be used. Quantum dots show very narrow emission band and thus they show saturated colors. Furthermore the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having a very low cadmium content.

Instead of quantum dots or in addition to quantum dots, also other quantum confinement structures may be used. The term "quantum confinement structures" should, in the context of the present application, be understood as e.g. quantum wells, quantum dots, quantum rods, tripods, tetrapods, or nano-wires, etcetera.

Organic phosphors can be used as well. Examples of suitable organic phosphor materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

Especially, in embodiments, luminescent materials are selected from garnets and nitrides, especially doped with trivalent cerium or divalent europium, respectively. The term "nitride" may also refer to oxynitride or nitridosilicate, etc.

The light generating device is configured to generate device light comprising one or more of (i) the light source light and (ii) the luminescent material light. Especially, the device light comprises both the light source light and the luminescent material light. In this way, e.g. white device light may be generated (see also below). The term "white light" herein, is known to the person skilled in the art. It especially relates to light having a correlated color temperature (CCT) between about 1800 K and 20000 K, such as between 2000 and 20000 K, especially 2700-20000 K, for general lighting especially in the range of about 2700 K and 6500 K. Yet further, in embodiments the correlated color temperature (CCT) is especially within about 15 SDCM (standard deviation of color matching) from the BBL (black body locus), especially within about 10 SDCM from the BBL, even more especially within about 5 SDCM from the BBL.

Especially, herein it is desired to provide different colors or different types of white light in different directions. In this way, a first type of light may propagate in a first direction and a second type of light may propagate in a second direction. Hence, a user may perceive different types of light dependent upon the position relative to the light generating device. Or, the light generating device may provide different functions. Especially, this may be enabled when the solid state light source and encapsulant (i.e. luminescent material) have no symmetrical configuration (relative to a symmetry plane parallel to the LED filament, especially including the length axis). For instance, the luminescent material may have an asymmetric distribution and/or the solid state light source may asymmetrically be positioned on the LED filament.

Hence, in embodiments for each of the solid state light sources of the set of solid state light sources may apply that relative to a first virtual plane parallel to length axis and intersecting with the solid state light source the encapsulant is asymmetrically configured relative to the first virtual plane. Especially, the first virtual plane may intersecting with a center of the solid state light source, such as with a center of the LED. Note that when the filament may be curved in a plane of the filament, the virtual plane(s) may also be curved essentially identical to the curvature(s) of the filament.

The light source light may have anyhow different propagation lengths through the luminescent material. However, as a result of the asymmetry, the distribution of the different propagation lengths becomes asymmetrical. As indicated above, in this way, a first type of light may propagate in a first direction and a second type of light may propagate in a second direction. Hence, in embodiments the encapsulant (and thus the luminescent material) may not be configured symmetrical relative to the solid state light source.

In specific embodiments, for one or more of the solid state light sources, especially a plurality of the solid state light sources (such as at least 5, like at least 10, even more especially at least 15; for instance in embodiments 50% of the total number of solid state light sources in the set)(110) applies that the length axis is within the first virtual plane. In further specific embodiments, this may apply to all solid state light sources within the set.

Alternatively or additionally, in embodiments for one or more of the solid state light sources, especially a plurality of the solid state light sources (such as at least 5, like at least 10, even more especially at least 15; for instance in embodiments 50% of the total number of solid state light sources in the set)(110) applies that the encapsulant is configured symmetrical relative to a second virtual plane configured parallel to the first virtual plane. In further specific embodiments, this may apply to all solid state light sources within the set. In such embodiments, the solid state light source may be configured symmetrical relative to the support, which may be desirable in view of manufacturing the LED filament.

Alternatively or additionally, in embodiments for one or more of the solid state light sources, especially a plurality of the solid state light sources (such as at least 5, like at least 10, even more especially at least 15; for instance in embodiments 50% of the total number of solid state light sources in the set)(110) applies that the encapsulant has no second virtual plane relative to which it is configured symmetrical. In further specific embodiments, this may apply to all solid state light sources within the set. In such embodiments, the solid state light source may be configured symmetrical relative to the support, which may be desirable in view of manufacturing the LED filament. However, the luminescent material as such has an asymmetrical distribution.

Alternatively or additionally, in embodiments for one or more of the solid state light sources, especially a plurality of the solid state light sources (such as at least 5, like at least 10, even more especially at least 15; for instance in embodiments 50% of the total number of solid state light sources in the set)(110) applies that the encapsulant partly covers the solid state light source. In further specific embodiments, this may apply to all solid state light sources within the set. In such embodiments, the solid state light source may be configured symmetrical relative to the support, which may be desirable in view of manufacturing the LED filament. However, the luminescent material is asymmetrical positioned on the support.

Alternatively or additionally, in embodiments for one or more of the solid state light sources, especially a plurality of the solid state light sources (such as at least 5, like at least 10, even more especially at least 15; for instance in embodiments 50% of the total number of solid state light sources in the set)(110) applies that the length axis is not within the first virtual plane. In further specific embodiments, this may apply to all solid state light sources within the set. In such embodiments, the solid state light source may be configured asymmetrical relative to the support. However, the luminescent material as such may have a symmetrical distribution and may be position symmetrical on the support, which may be desirable in view of manufacturing the LED filament.

As indicated above, this may lead to an asymmetrical distribution of the optical properties of the device light.

Hence, in symmetric embodiments a cross-section of the encapsulant, perpendicular to the length axis may have a shape of a circle segment. In yet other embodiments, a cross-section of the encapsulant, perpendicular to the length axis may have a shape of a (isosceles) triangle or a (isosceles) triangle with rounded top, or square, or square with rounded corners.

However, in asymmetric embodiments the cross-section may thus be asymmetric. For instance, in embodiments the encapsulate may comprise halves, in a cross-section perpendicular to the length axis, which are not the same. In embodiments, the encapsulate may have two sides or halves that are not the same (with respect to (the center (of the light output surface) of an LED). In specific embodiments, an (averaged) path length $PL_1$ at the one side of an LED measured from (the center (of the light output surface) is different from an average path length $PL_2$ at another side of the LED. Especially, in embodiments $PL_1 > PL_2$, such as $PL_1 \geq 1.1 * PL_2$. In specific embodiments, $PL_1 > 1.2 * PL_2$. For instance, in embodiments $PL_1 < PL_2 \leq 2.5 * PL_1$.

In specific embodiments, for one or more of the solid state light sources, especially a plurality of the solid state light sources (such as at least 5, like at least 10, even more especially at least 15; for instance in embodiments 50% of the total number of solid state light sources in the set)(110) may apply that device light emanating away from the solid state light source in a third virtual plane perpendicular to the first virtual plane and perpendicular to the support in different directions has different color points, wherein a distribution of the color points is not symmetrical relative to the first virtual plane. Hence, different colors may be provided in different direction.

However, this may also apply in specific embodiments to different correlated color temperatures. Hence, in specific (other) embodiments the light generating device may be configured to generate white device light, and for one or more of the solid state light sources, especially a plurality of the solid state light sources (such as at least 5, like at least 10, even more especially at least 15; for instance in embodiments 50% of the total number of solid state light sources in the set)(110) may apply that device light emanating away from the solid state light source in a third virtual plane perpendicular to the first virtual plane and perpendicular to the support in different directions has different correlated color temperatures, wherein a distribution of the correlated color temperatures is not symmetrical relative to the first virtual plane.

Especially, in embodiments a lower correlated color temperature $T_L$ is at maximum 2500 K and wherein a higher correlated color temperature $T_H$ is at least 2300 K, wherein $T_L<T_H$. In this way, e.g. functional light and sphere light may be provided. Further, especially the difference is at least 300 K. In embodiments, the lower correlated color temperature $T_L$ is preferably at maximum 2300 K, more preferably at maximum 2150 K, most preferably at maximum 2050 K. In embodiments, higher correlated color temperature $T_H$ is preferably at least 2700 K, more preferably at least 3000 K, most preferably at least 3300 K.

Hence, in specific embodiments a difference between a higher correlated color temperature $T_H$ and a lower correlated color temperature $T_L$ is at least 300 K. In this way, different CCTs may be perceived well. In embodiments, the difference is preferably at least 500 K, more preferably at least 700 K, most preferably at least 900 K.

As further also described below, the light generating device comprise such LED filament. Thereby, a light generating device may be provided having an asymmetric distribution of optical properties. Further, the light generating device may comprise a plurality of such LED filaments. In the latter embodiments, the plurality of LED filaments may be such, the asymmetric distributions are aligned, and thus still for the light generating device applies that it may provide device light having an asymmetric distribution of optical properties. Hence, to one side the device may provide device light with different optical properties than the device provides to another side. The one side and the other side may be defined relative to a plane including e.g. a device axis (see also below) or relative to a plane perpendicular to such device axis.

Hence, in specific embodiments the light generating device may comprise one or more of the LED filaments, wherein the light generating device is configured to generate first device light in a first direction and second device light in a second direction (different from the first direction), wherein the first device light and the second device light have different correlated color temperatures. Especially, the first direction and the second direction are opposite to each other.

In embodiments, the light generating device comprises a device axis (A1), wherein a plurality of the solid state light sources are configured along a length of the device axis (A1), wherein two or more of the solid state light sources are configured at essentially the same distances (d1) from the device axis (A1). Hence, in embodiments, a filament may have a helical structure. In such embodiments, it may be that one light source blocks (too much) light of another light source.

Hence, in specific embodiments wherein a kind of circular structure of the filament is applied, the filament may be configured in a spiral type of configuration. In this way, it is possible to have one light source not blocking too much another light source. Blocking may be too much when e.g. an optical axis of the light source light of one light source intersects with another light source. Therefore, in specific embodiments the light generating device comprises a device axis (A1), wherein a plurality of the solid state light sources are configured along a length of the device axis (A1), wherein two or more of the solid state light sources are configured at different distances (d1) from the device axis (A1), and wherein for two or more of the solid state light sources applies that a second axis (A2) parallel to the device axis (A1) intersects only with one of the solid state light sources.

As can be derived from the above, especially in embodiments the plurality of solid state light sources are configured in a helical configuration wherein a filament distance (d2) to the device axis (A1) is constant (especially helical) or increases (especially spiral) in a direction along the device axis (A1). In this way a kind of spiral shaped filament may be provided. In this way, curved 3D shapes may be provided with a plurality of windings.

Hence, in embodiments the LED filament may have a 3D spiral configuration or helix configuration.

Herein, below a number of further embodiments are described.

Amongst others, a LED lamp comprising one or more, especially a plurality, such as at least three, LED filaments adapted for, in operation, emitting LED filament light is herein suggested. Such filaments may be straight. However, in other embodiments such filaments may be curved, such as having a helical shape or spiral shape. Hence, the lamp may comprises a plurality of light generating devices, wherein each light generating device comprises a filament, and wherein each light generating device may have a device axis.

Herein, the term "filament" may refer to support and a plurality of solid state light sources supported by the support. The filament may especially comprise a 1D array of solid state light sources. A 2D array of light solid state light sources may also be possible, though especially with the number of rows (n1) much smaller than the number (n2) of solid state light sources in the respective rows, such as $n1/n2 \leq 0.2$, like $n1/n2 \leq 0.1$, especially $n1/n2 \leq 0.05$. In specific embodiments, the support supports a (1D) array of solid state light sources at one side of the support, and optionally another (1D) array of solid state light sources at the other side of the support. The use of a 1D array is a better configuration to provide different colors or different types of white light in different directions e.g. due to a larger difference in path length and/or less/reduced light shielding (by one or more LEDs of a second column). The use of a 1D array is a low-cost configuration in terms of materials (e.g. LEDs) and/or assembly costs. Thus the support may comprise a single LED column on a first major side, and optionally another single LED column on a second major side opposite to said first major side.

The support may in embodiments have a thickness of 0.05-4 mm, such as 0.05-1 mm, like 0.1-0.5 mm. The support may have a width of 0.1-5 mm, such as 0.2-3 mm, like 0.3-2 mm. The length of the support (and thus in embodiments essentially the length of the filament), herein also indicated as first length (L1), may in embodiments e.g. be selected from the range of 10-500 mm, such as 15-200 mm, like in the range of 20-100 mm, such as in the range of 25-80 mm, for example 40 or 50 mm. Hence, the support (and thus essentially also the filament) may have relative high aspect ratios (length/width or length/thickness), such as at least 10, even more especially at least 15, such as at least 20, like even more especially at least 50. Large aspect ratios may better mimic a filament.

The support may e.g. comprise glass or sapphire. In other embodiments, the support may comprise a polymeric material. As also indicated below, the support may be rigid (self-supporting), but may (in polymeric embodiments) also be flexible. The first length is especially the length along the axis of elongation.

In embodiments, the support may be translucent. In other embodiment, the support may be transparent. Hence, the material of the support may be translucent or transparent for light, especially visible light. For transparent materials, see also below.

The elongated filament may have a straight axis of elongation when the elongated filament is straight. However, the elongated filament may also—in embodiments—include a plurality of segments, of which two or more may be configured under an angle (≠180°; ≠0°) relative to one another. Alternatively or additionally, the elongated filament may include one or more curvatures, for instance a curved segment, or two segments that are configured under an angle and which are connected via a curved segment. Hence, in embodiments the axis of elongation may also include one or more curvatures and/or one or filament segments that are configured under an angle (≠180°) relative to one another. Hence, the filament may comprise a single segment, or may comprise a plurality of segments (with each segment comprising one or more solid state light sources). Especially, herein the elongated filaments are essentially straight filaments. The one or more filaments may in embodiments be self-supporting (straight) filaments (see also above).

Such type of elongated light sources, wherein a plurality of solid state light sources are configured on a support with a resin including luminescent material configured around at least part of the plurality of LEDs are known in the art as (embodiments of) LED filaments. They may generate white light, due to the combination of e.g. blue emitting solid state light sources and a luminescent material, such as a cerium comprising garnet, that is configured to convert part of the blue light into yellow light, thereby providing white light. Of course, also other combinations of light sources and luminescent materials may be chosen, such as blue solid state light source light with yellow and red luminescing luminescent material(s); blue solid state light source light with green and red luminescing luminescent material(s); UV solid state light source light with blue, green and red luminescing luminescent material(s). Further luminescent materials may also be applied in any of the suggested combinations, such as cyan and/or amber luminescent materials.

In embodiments, the filament may comprise a substrate (which is an embodiment of a support) having an elongated body with an extension along an elongation axis, a plurality of solid state light sources, such as LEDs, mechanically coupled to the substrate, and wiring for powering the plurality of LEDs.

Further, also different types of solid state light sources may be applied (optionally in embodiments at different sides of the support; see also above). For instance, the blue emitting solid state light sources may be applied in combination with one or more of cyan light emitting solid state light sources and amber light emitting solid state light sources. The cyan light emitting solid state light sources and amber light emitting solid state light sources, respectively, may be obtained with using the same type of solid state light source used for generating the blue solid state light source light, but in combination with a specific luminescent material.

Therefore, in embodiments the elongated light source comprises a LED filament, wherein the elongated light source comprises luminescent material configured to convert at least part of the solid state light source light into luminescent material light, wherein the light source light comprises the luminescent material light and optionally solid state light source light.

The term "luminescent material" may thus also refer to a plurality of different luminescent materials.

Hence, in general the filament light will have a spectral distribution with a plurality of wavelengths, such as is the case with the blue light of a blue LED or with the yellow light of a trivalent cerium comprising garnet based luminescent material or many $Eu^{2+}$ based luminescent material.

Therefore, in embodiments each elongated filament comprises a support and a plurality of solid state light sources (at one or at both sides of the support). The solid state light sources are especially configured to generate solid state light source light. In embodiments, this light source light may at least partly be converted into luminescent material light by a luminescent material. Hence, the filament light generated by the filament may comprise one or more of solid state light source light and luminescent material light, especially in embodiments both. Note that in embodiments the spectral distribution of the filament light may vary over the length of the filament and/or depend upon the side of the filament.

Hence, the elongated filament has a first axis of elongation having a first length (L1), wherein the elongated filament is configured to generate filament light over at least part of the first length (L1). For instance, over at least 70% of its length, especially at least 80% of its length, even more especially at least 90%, such as yet even more especially at least 95%, such as at least 98% of its length, filament light may be generated. In general, over essentially the entire length of the filament light may be generated, such that the filament is perceived as a (classical) filament.

The solid state light sources may have a pitch selected from the range of 0.3-3 mm.

In specific embodiments, solid state light sources are only available at one side of the support. In such embodiments, the filament may essentially not be a radial emitter (radial with respect to the first axis of elongation). In other embodiments, solid state light sources are only available at both sides of the support. In such embodiments, the filament may essentially be a radial emitter (radial with respect to the first axis of elongation).

In embodiments, the spectral distribution of the filament light generated at one side of the filament may be different from the filament light generated at the other side of the filament. This may be used for creating specific effects. This may also be used to control the spectral distribution of the light generating device light.

As indicated above, with filaments a retro type of lamp may be provided, including a light transmissive bulb, and even when desired including a pump stem. For instance, the optical element may be attached to the pump stem.

Hence, the term "light generating device" may also refer to a lamp, especially a lamp with a light transmissive bulb wherein the one or more filaments and the optical element are configured.

The light generating device may have a light generating device axis or axis of elongation. For instance, the outer shape of the light generating device may essentially be symmetrical, with a rotational axis and/or one or more planes of symmetry, like many conventional light bulbs. In specific embodiments, the second axis of elongation may essentially coincide with a light generating device axis or axis of elongation.

In embodiments the light generating device may comprise (i) a base, and (ii) an outer bulb, together defining an enclosure enclosing the plurality of elongated filaments and the optical element, wherein the solid state light sources comprise LEDs, and wherein in specific embodiments the elongated filaments are straight elongated elements.

Especially, the light generating device is a retrofit lamp. In embodiments, the light generating device may be included in or constitute a LED bulb or retrofit lamp which is connectable to a lamp or luminaire socket by way of some appropriate connector. For example an Edison screw, a bayonet fitting, or another type of connector suitable for the lamp or luminaire known in the art. The connector may be connected to a base portion, to which the elongated filament(s) and the optical element may be functionally coupled.

The light generating device may comprise a control system, such as e.g. at least partly comprised by the base. The control system may be configured to control one or more of intensity of the filament light, intensity of the light source light of individual light sources or sets of light sources, color point, color temperature, etc.

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

The control system may also be configured to receive and execute instructions form a remote control. In embodiments, the control system may be controlled via an App on a device, such as a portable device, like a Smartphone or I-phone, a tablet, etc. The device is thus not necessarily coupled to the light generating device, but may be (temporarily) functionally coupled to the light generating device.

Hence, in embodiments the control system may (also) be configured to be controlled by an App on a remote device. In such embodiments the control system of the light generating device may be a slave control system or control in a slave mode. For instance, the light generating device may be identifiable with a code, especially a unique code for the respective light generating device. The control system of the light generating device may be configured to be controlled by an external control system which has access to the light generating device on the basis of knowledge (input by a user interface of with an optical sensor (e.g. QR code reader) of the (unique) code. The light generating device may also comprise means for communicating with other systems or devices, such as on the basis of Bluetooth, Wifi, ZigBee, BLE or WiMax, or another wireless technology.

Hence, in embodiments, the control system may control in dependence of one or more of an input signal of a user interface, a sensor signal (of a sensor), and a timer. The term "timer" may refer to a clock and/or a predetermined time scheme.

In yet a further aspect, the invention provides a lamp comprising the light generating device as defined herein. Hence, embodiments the light generating device may at least partly, or even entirely, be enclosed by an envelope. Especially, in embodiments the lamp is a retrofit lamp.

The light generating device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, etc. Especially, the light generating device may be used for domestic applications or hospitality applications.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily to scale.

DETAILED DESCRIPTION OF THE EMBODIMENTS

Figure 1A:
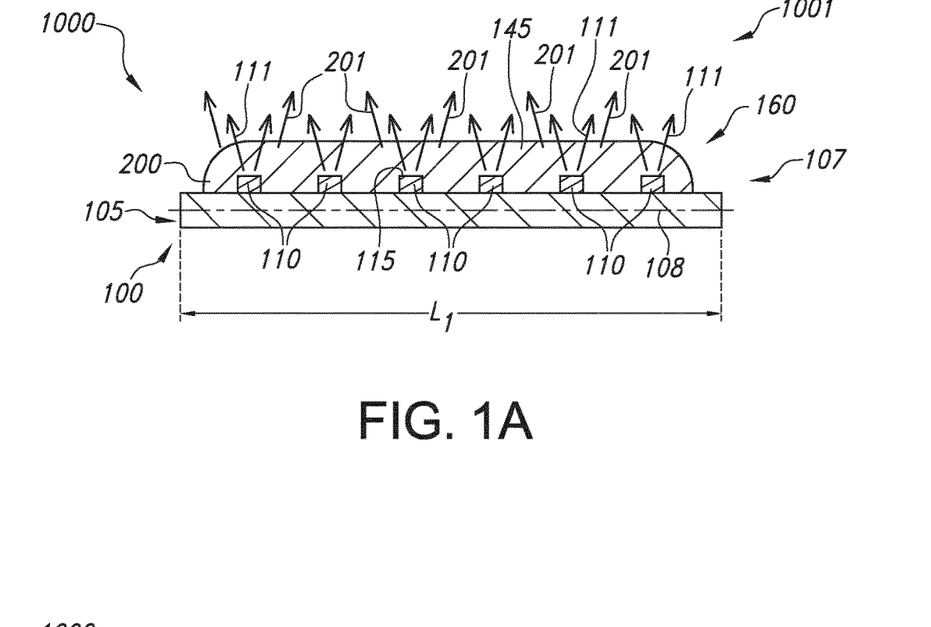
FIGS. 1a-1h schematically depict a retrofit lamp, without an optical element, and an associated intensity distribution.

FIG. 1a schematically depicts an embodiment of a light generating device 1000 comprising an LED filament 100. The LED filament 100 comprises a support 105, a set 107 of solid state light sources 110, and an encapsulant 160. The LED filament 100 has a length axis 108 having a first length L1. The solid state light sources 110 are arranged over the first length L1 of the LED filament 100 on the support 105. The solid state light sources 110 are configured to generate light source light 111. In embodiments, the solid state light sources 110 may be configured to generate blue light source light 111. The encapsulant 160 encloses at least part of each of the solid state light sources 110 of the set 107 of solid state light sources 110. The encapsulant 160 comprises a luminescent material 200 configured to convert at least part of the light source light 111 into luminescent material light 201. In embodiments, the luminescent material 200 may be configured to convert at least part of the light source light 111 into luminescent material light 201 having wavelengths in one or more of (i) the green and/or red, and (ii) yellow and optionally red, especially in combination with blue light source light 111. Hence, the luminescent material may be configured to generate yellow light and/or red light due to conversion of at least part of the blue light. The luminescent material may also be configured to generate green light and/or red light due to conversion of at least part of the blue light. As indicated above, the term "luminescent material"

may also refer to a plurality of different luminescent materials. Especially, the luminescent material may comprise a garnet luminescent material as described above.

Especially, the light generating device 1000 is configured to generate device light 1001 comprising one or more of the light source light 111 and the luminescent material light 201. Reference 115 refers to a light emitting surface of the solid state light source 110, such as a LED die.

The solid state light sources 110 may be available on a substrate or support 105. Further, the solid state light sources 110 (and the substrate 105) may especially be embedded in a light transmissive material, such as a resin. The light transmissive material enclosing the light sources is indicated with reference 145. Especially, the light transmissive material may comprise, such as embed, a luminescent material 200. Especially, this light transmissive material 145 may be a resin hosting luminescent material 200, such as an inorganic luminescent material in an organic resin. The resin may e.g. an acrylate or a silicone resin or an epoxy resin, etc. The combination of light transmissive material 145 and luminescent material is herein indicated as encapsulant 160.

The embodiment schematically depicts a cross-sectional view of a plane of drawing also comprising the length axis 108.

Figure 1B:
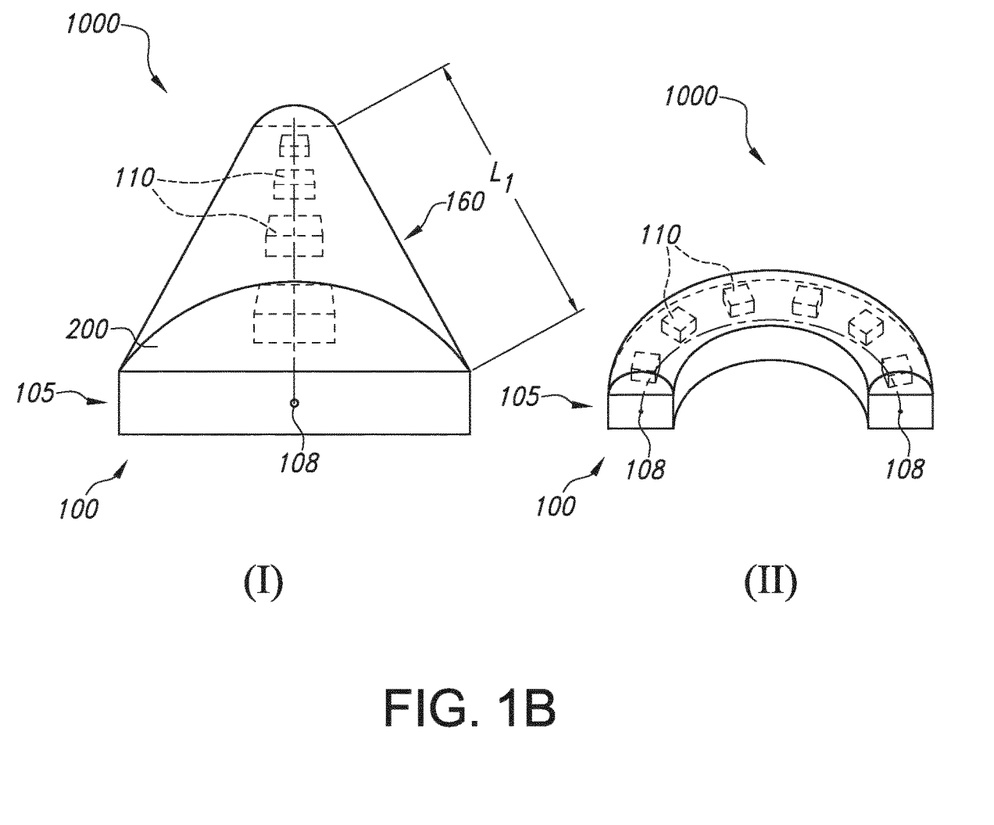

FIG. 1b schematically depicts in embodiment I a perspective view of the same embodiment as schematically depicted in FIG. 1a.

Embodiment II of FIG. 1b, however, schematically depicts a perspective view of a curved filament. Note that the length axis 108 is now also curved. It may be a body axis of the support 105. The length of this axis is determined along the axis 108. When the filament 100 may be curved in a plane of the filament 100, the virtual plane(s) may also be curved essentially identical to the curvature(s) of the filament 200. In other words, when the support is curved in the plane of the support, the length axis will also be curved, and likewise the first virtual plane and second virtual may be. The length axis in embodiment II in FIG. 1b starts at the first face left, follows the curved body axis, and ends at the second face right.

Figure 1C:
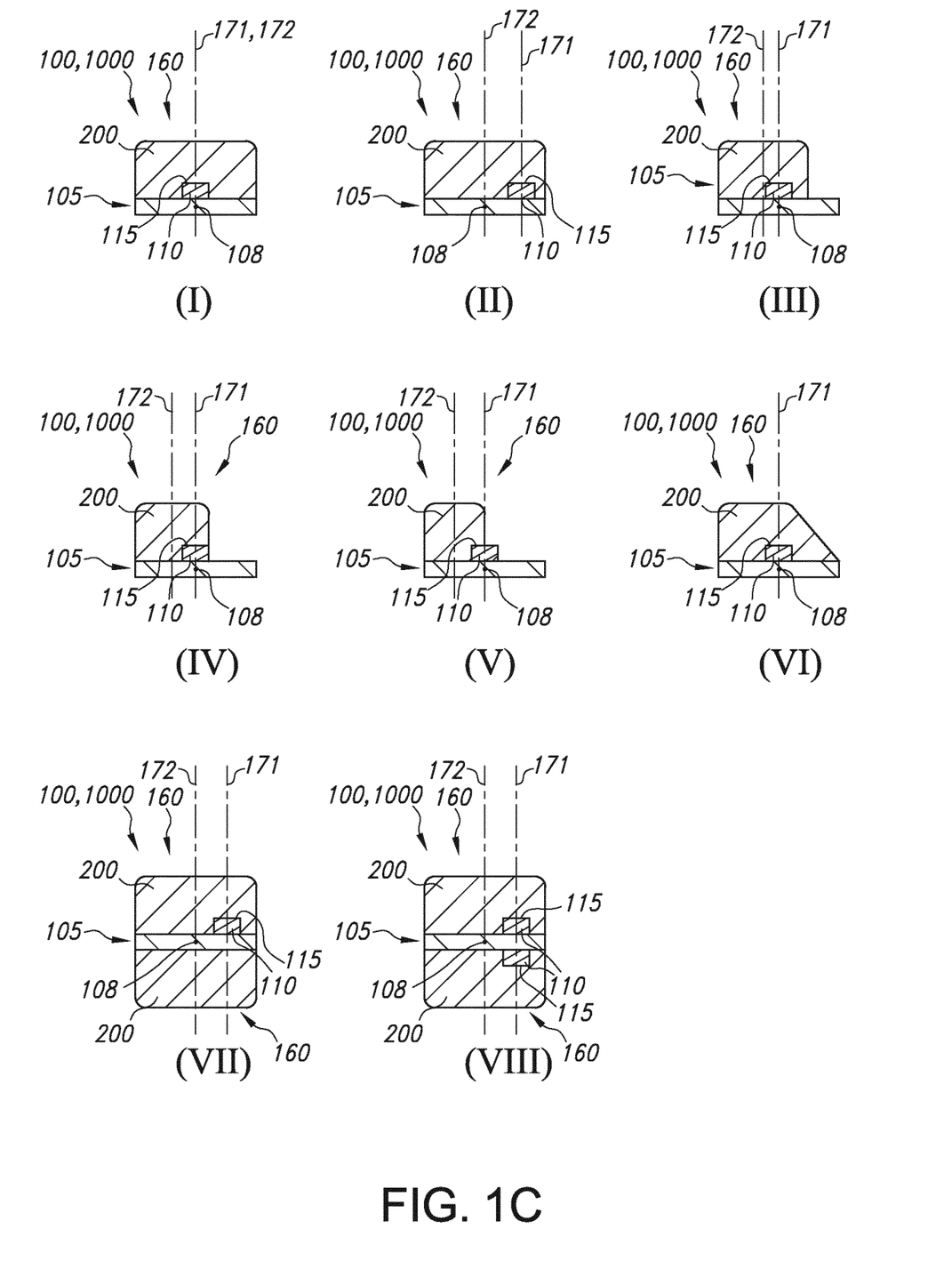

FIG. 1c, embodiments I-VIII, show embodiments of such filament 100 as schematically depicted in FIG. 1a, but now in a cross-sectional view, i.e. a cross-sectional plane perpendicular to the drawing of FIG. 1a (except for embodiments VII and VIII).

In embodiment I of FIG. 1c, for (each of) the solid state light source(s) 110 of the set of solid state light sources 110 applies that relative to a first virtual plane 171 parallel to length axis 108 and intersecting with the solid state light source 110 the encapsulant 160 is symmetrically configured relative to the first virtual plane 171. Note that this virtual plane 171 may be the plane of drawing in FIG. 1a.

For all other embodiments in FIG. 1c, i.e. embodiments II-VIII applies that for (each of) the solid state light source(s) 110 of the set of solid state light sources 110 applies that relative to a first virtual plane 171 parallel to length axis 108 and intersecting with the solid state light source 110 the encapsulant 160 is asymmetrically configured relative to the first virtual plane 171. Referring to embodiments III, IV, V, and VI, for one or more of the solid state light sources, especially a plurality of the solid state light sources (such as at least 5, like at least 10, even more especially at least 15; for instance in embodiments 50% of the total number of solid state light sources in the set) 110 applies that the length axis 107 is within the first virtual plane 171. Referring to embodiments II, III, IV, V, and VII, and VIII, for one or more of the solid state light sources, especially a plurality of the solid state light sources (such as at least 5, like at least 10, even more especially at least 15; for instance in embodiments 50% of the total number of solid state light sources in the set) 110 applies that the encapsulant 160 is configured symmetrical relative to a second virtual plane 172 configured parallel to the first virtual plane 171. Referring to embodiment VI, for one or more of the solid state light sources, especially a plurality of the solid state light sources (such as at least 5, like at least 10, even more especially at least 15; for instance in embodiments 50% of the total number of solid state light sources in the set) 110 applies that the encapsulant 160 has no second virtual plane 172 relative to which it is configured symmetrical. Referring to embodiment V, for one or more of the solid state light sources, especially a plurality of the solid state light sources (such as at least 5, like at least 10, even more especially at least 15; for instance in embodiments 50% of the total number of solid state light sources in the set) 110 applies that the encapsulant 160 partly covers the solid state light source 110. Referring to embodiments II, VII, and VIII, for one or more of the solid state light sources, especially a plurality of the solid state light sources (such as at least 5, like at least 10, even more especially at least 15; for instance in embodiments 50% of the total number of solid state light sources in the set) 110 applies that the length axis 107 is not within the first virtual plane 171. Referring to embodiments VII and VIII the encapsulant 160 may be configured at both sides of the support 105. Referring to embodiment VIII at both sides of the support 105 solid state light sources 110 may be configured. Of course this may also apply to other embodiments, such as those schematically depicted under embodiment numbers II-VII.

Figure 1D:
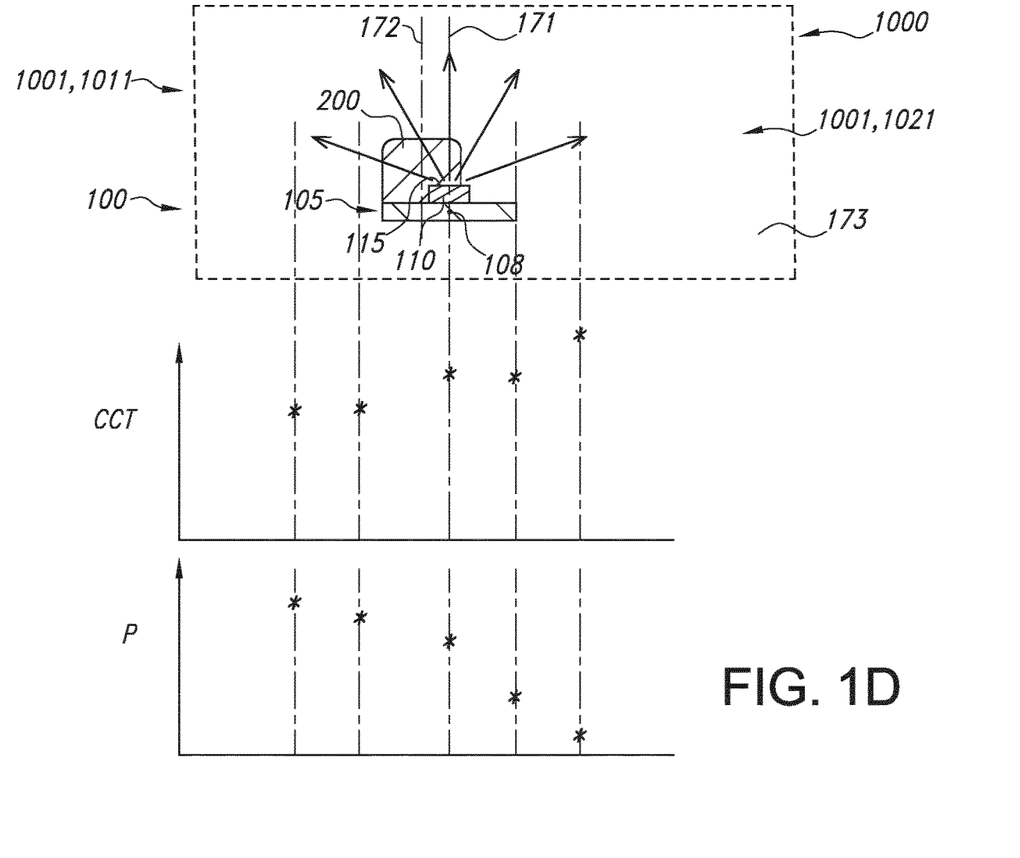

FIG. 1d schematically depicts in the top a number of light directions of device light 1001. For each direction, the device light 1001 may have a color point.

In embodiments, not depicted in FIG. 1d, for one or more of the solid state light sources, especially a plurality of the solid state light sources (such as at least 5, like at least 10, even more especially at least 15; for instance in embodiments 50% of the total number of solid state light sources in the set) 110 applies that device light 1001 emanating away from the solid state light source 110 in a third virtual plane 173 perpendicular to the first virtual plane and perpendicular to the support 105 in different directions has different color points, wherein a distribution of the color points is not symmetrical relative to the first virtual plane 171. Note that the virtual plane 173 may in fact be the plane of drawing of FIG. 1c.

In the middle in FIG. 1d, the embodiment is schematically depicted wherein the light generating device 1000 is configured to generate white device light 1001, and wherein for one or more of the solid state light sources, especially a plurality of the solid state light sources (such as at least 5, like at least 10, even more especially at least 15; for instance in embodiments 50% of the total number of solid state light sources in the set) 110 applies that device light 1001 emanating away from the solid state light source 110 in a third virtual plane 173 perpendicular to the first virtual plane 171 and perpendicular to the support 105 in different directions has different correlated color temperatures, wherein a distribution of the correlated color temperatures is not symmetrical relative to the first virtual plane 171.

In embodiments, a lower correlated color temperature TL is at maximum 2500 K and wherein a higher correlated color temperature TH is at least 2300 K, wherein TL<TH. For instance, a difference between a higher correlated color temperature TH and a lower correlated color temperature TL is at least 300 K.

Hence, FIG. 1d in fact schematically depicts an embodiment of the light generating device 1000, comprising one or more of the LED filaments 100, wherein the light generating device 1000 is configured to generate first device light 1011 in a first direction and second device light 1021 in a second direction (different from the first direction), wherein the first device light 1011 and the second device light 1021 have different correlated color temperatures.

Hence, referring to embodiments II-VIII in FIG. 1c, and referring to FIG. 1d, would at one or more light sources the color point be measured along a circle surrounding the respective light source, wherein the circle would be perpendicular to the axis of elongation, an intensity (energy basis) averaged color point at one side of the circle would differ from an intensity (energy basis) averaged color point at the other side of the circle. For instance, one or more of u' and v' may differ at least 0.05, or even about at least 0.06.

The differences in color may be based on the fact that when the path length of the light source light through the encapsulant is longer there will be more conversion and less light source light remains unconverted, whereas when the path length of the light source light is shorter, there will be less conversion and more light source light remains unconverted. Hence, with the asymmetric distribution, an asymmetric distribution of the path length of the light source light is obtained, which is schematically depicted in FIG. 1d in the bottom. In specific embodiments, an (averaged) path length $PL_1$ at the one (e.g. left) side of an LED measured from (the center (of the light output surface) is different from an average path length $PL_2$ at the other side (e.g. right side) of the LED. Especially, in embodiments $PL_1 > PL_2$, such as $PL_1 \geq 1.1 * PL_2$. In specific embodiments, $PL_1 \geq 1.2 * PL_2$. For instance, in embodiments $PL_1 < PL_2 \leq 2.5 * PL_1$.

Figure 1E:
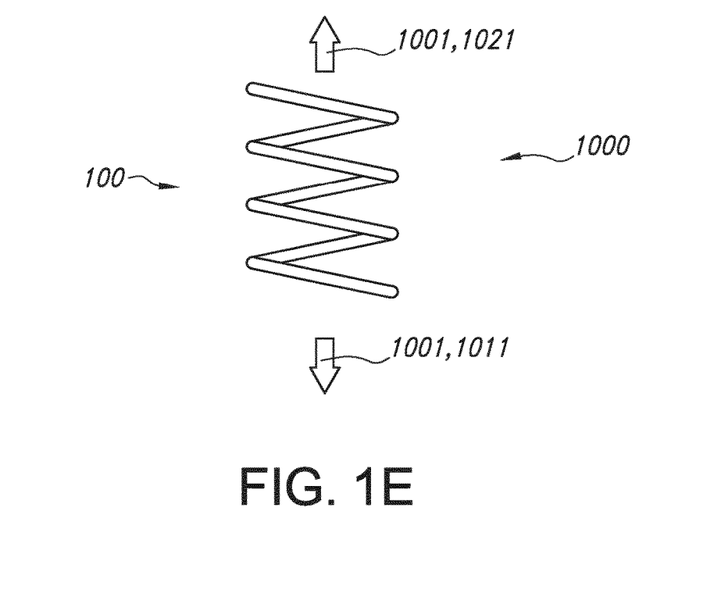

FIG. 1e schematically depicts an embodiment wherein the filament 100 is shaped like a helix. Also here, the light generating device 1000 is configured to generate first device light 1011 in a first direction and second device light 1021 in a second direction (different from the first direction), wherein the first device light 1011 and the second device light 1021 have different correlated color temperatures. Especially, the first direction and the second direction are opposite to each other.

Figure 1F:
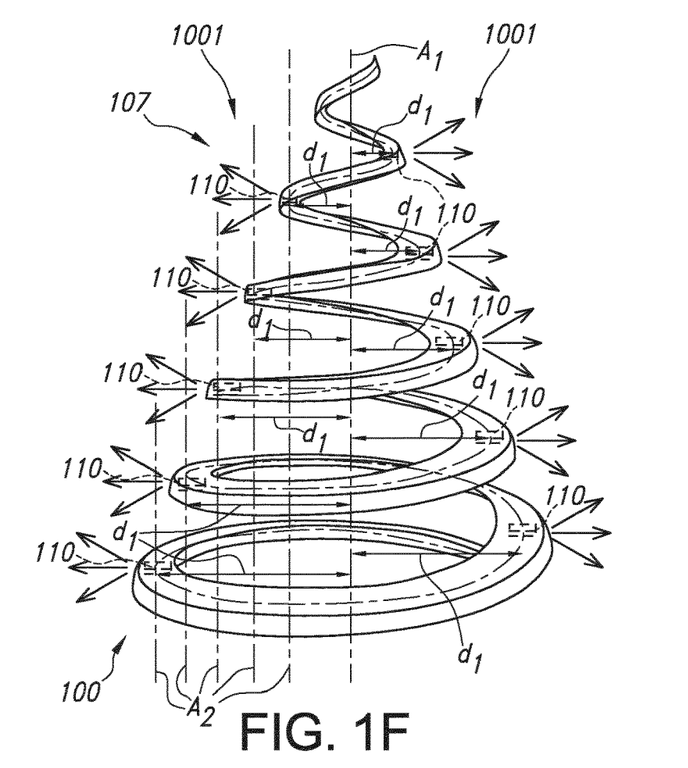

FIG. 1f schematically depicts a spiral shaped filament 100. Here, the light generating device 1000 comprises a device axis A1, wherein a plurality of the solid state light sources 110 are configured along a length of the device axis A1, wherein two or more of the solid state light sources 110 are configured at different distances d1 from the device axis A1, and wherein for two or more of the solid state light sources 110 applies that a second axis A2 parallel to the device axis A1 intersects only with one of the solid state light sources 110. Hence, in embodiments the plurality of solid state light sources 110 are configured in a helical configuration wherein a filament distance d2 to the length axis A1 increases in a direction along the device axis A1.

It appears appreciated and desired by users to have a retrofit lamp which has the look of an incandescent bulb. For this purpose, one can simply make use of the infrastructure for producing incandescent lamps based on glass and replace the filament with LEDs emitting white light.

One of the concepts is based on LED filaments placed in such a bulb. The appearances of these lamps are highly appreciated as they look highly decorative.

Figure 1G:
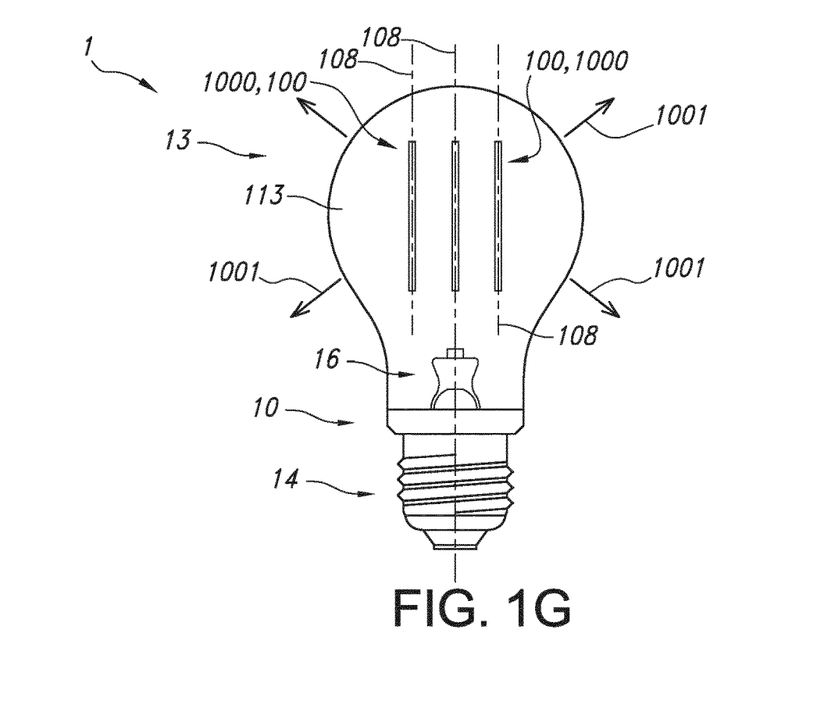

FIG. 1g schematically depicts an embodiment of a lamp 1 comprising the light generating device 1000 as defined herein. More especially, the lamp comprises a plurality of such light generating devices. Here, especially the lamp 1 is a retrofit lamp.

The lamp 1 comprises e.g. (i) a base 14, and (ii) an outer bulb 13. The outer bulb together with the base may define an enclosure 113 enclosing the plurality of elongated filaments 100. Here, in this schematically depicted embodiment the elongated filaments 100 are straight elongated elements 100. The light generating device 10 has a device axis or (device) axis of elongation 15. The device 10 is essentially rotationally symmetry around this axis 15 and/or comprises one or more (here in fact a plurality) of symmetry planes, which each comprise the device axis of elongation 15. Reference 16 indicates an optional pump stem.

Figure 1H:
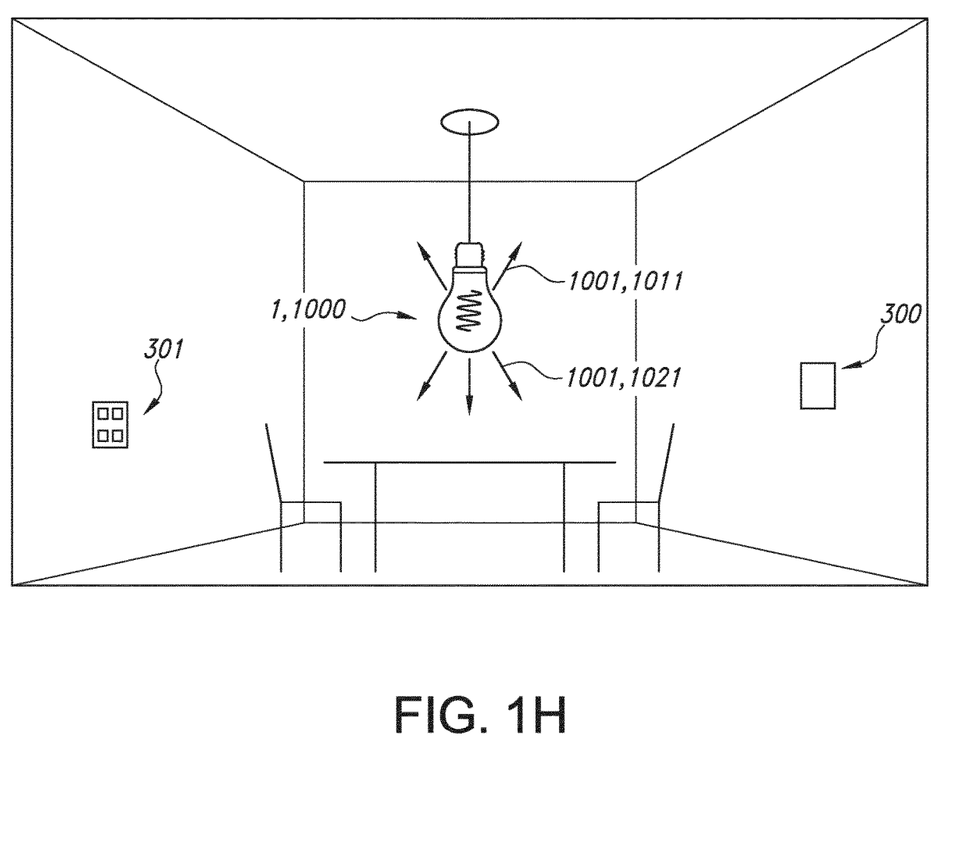

FIG. 1h schematically depicts an embodiment of an application of a lamp 1. On the table, functional light with a higher CCT may be provided. Hence, this device light 1001 is indicated as second device light 1021. To the ceiling, warm white device light may be provided. This device light 1001 is indicated with reference 1011. Reference 301 refers to an optional user interface and reference 300 refers to an optimal control system for controlling the light generating device(s).

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" also includes embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A light generating device comprising an LED filament, wherein the LED filament comprises a support, a set of solid state light sources, and an encapsulant, wherein:
   the LED filament has a length axis having a first length;
   the support supports a 1D array of solid state light sources at one side of the support;
   the solid state light sources are arranged over the first length of the LED filament on the support, wherein the solid state light sources are configured to generate light source light;
   the encapsulant encloses at least part of each of the solid state light sources of the set of solid state light sources, wherein the encapsulant comprises a luminescent material configured to convert at least part of the light source light into luminescent material light;
   the light generating device is configured to generate device light comprising one or more of (i) the light source light and (ii) the luminescent material light;
   for each of the solid state light sources of the set of solid state light sources applies that relative to a first virtual plane parallel to length axis and intersecting with the solid state light source the encapsulant is asymmetrically configured relative to the first virtual plane;
   wherein the light generating device is configured to generate white device light, and wherein for a plurality of the solid state light sources applies that device light emanating away from each solid state light source in a third virtual plane perpendicular to the first virtual plane and perpendicular to the support in different directions has different correlated color temperatures, wherein a distribution of the correlated color temperatures is not symmetrical relative to the first virtual plane; and
   wherein a lower correlated color temperature $T_L$ is at maximum 2500 K and wherein a higher correlated color temperature $T_H$ is at least 2300 K, wherein $T_L < T_H$, and wherein a difference between a higher correlated color temperature $T_H$ and a lower correlated color temperature $T_L$ is at least 300 K.

2. The light generating device according to claim 1, wherein for one or more of the solid state light sources applies that the length axis is within the first virtual plane.

3. The light generating device according to claim 1, wherein for a plurality of the solid state light sources applies that the encapsulant is configured symmetrical relative to a second virtual plane configured parallel to the first virtual plane.

4. The light generating device according to claim 1, wherein for a plurality of the solid state light sources applies that the encapsulant has no second virtual plane relative to which it is configured symmetrical, the second virtual plane defined as being configured parallel to the first virtual plane.

5. The light generating device according to claim 1, wherein for a plurality of the solid state light sources applies that the encapsulant partly covers the solid state light source.

6. The light generating device according to claim 1, wherein for a plurality of the solid state light sources applies that the length axis is not within the first virtual plane.

7. The light generating device according to claim 1, wherein for a plurality of the solid state light sources applies that device light emanating away from the solid state light source in a third virtual plane perpendicular to the first virtual plane and perpendicular to the support in different directions has different color points, wherein a distribution of the color points is not symmetrical relative to the first virtual plane.

8. The light generating device according to claim 1, wherein for a plurality of the solid state light sources applies that a first path length of the light source light at one side of each solid state light source is different from a second path length of the light source light at the other side of each solid state light source.

9. The light generating device according to claim 1, comprising one or more of the LED filaments, wherein the light generating device is configured to generate first device light in a first direction and second device light in a second direction [different from the first direction], wherein the first device light and the second device light have different correlated color temperatures.

10. The light generating device according to claim 9, wherein the first direction and the second direction are opposite to each other.

11. The light generating device according to claim 1, wherein the LED filament has a 3D spiral configuration or helix configuration.

12. The light generating device according to claim 1, wherein the light generating device, comprises a device axis, wherein a plurality of the solid state light sources are configured along a length of the device axis, wherein two or more of the solid state light sources are configured at different distances from the device axis, and wherein for two or more of the solid state light sources applies that a second axis parallel to the device axis intersects only with one of the solid state light sources.

13. The light generating device according to claim 12, wherein the plurality of solid state light sources are configured in a helical configuration wherein a filament distance to the device axis increases in a direction along the device axis.

14. A lamp comprising the light generating device according to claim 1, wherein the lamp is a retrofit lamp.

* * * * *